United States Patent [19]

Jenne

[11] 4,003,036

[45] Jan. 11, 1977

[54] SINGLE IGFET MEMORY CELL WITH BURIED STORAGE ELEMENT

[75] Inventor: Fredrick Benjamin Jenne, Los Gatos, Calif.

[73] Assignee: American Microsystems, Inc., Santa Clara, Calif.

[22] Filed: Oct. 23, 1975

[21] Appl. No.: 624,868

[52] U.S. Cl. .......................... 340/173 R; 307/238; 357/20

[51] Int. Cl.² ....................................... G11C 11/40

[58] Field of Search ................. 340/173 R, 173 SP; 307/238, 279; 357/20, 51, 52

[56] References Cited

UNITED STATES PATENTS 3,787,822  1/1974  Rioult .......................... 340/173 SP

*Primary Examiner*—Terrell W. Fears
*Attorney, Agent, or Firm*—Owen, Wickersham & Erickson

[57] ABSTRACT

A semiconductor read/write memory comprised of an array of cells, each having a single active element that is a IGFET device formed in a recess with one source or drain region located directly above and its other source or drain region located within a buried storage capacitor. The gate of each device is connected to an address line in the array, and transverse diffused bit lines interconnect the drains of the devices in aligned and spaced apart cells. Voltage applied via an address line activates a gate to charge its buried capacitor and store a signal when its connected bit line is also activated. Readout of stored charges is controlled by the address line through the connected bit line in the conventional manner. A memory device with an array of such single element cells can be fabricated by forming an array of N-type buried layer diffusions in a P substrate, depositing an epitaxial layer of lightly doped P material that extends above the buried layer diffusions, forming a relatively thin diffusion of N material spaced directly above the buried layer, forming a recess that passes through the thin N layer and the epitaxial layer into the thicker buried N layer, and thereafter forming a gate within the recess.

17 Claims, 13 Drawing Figures

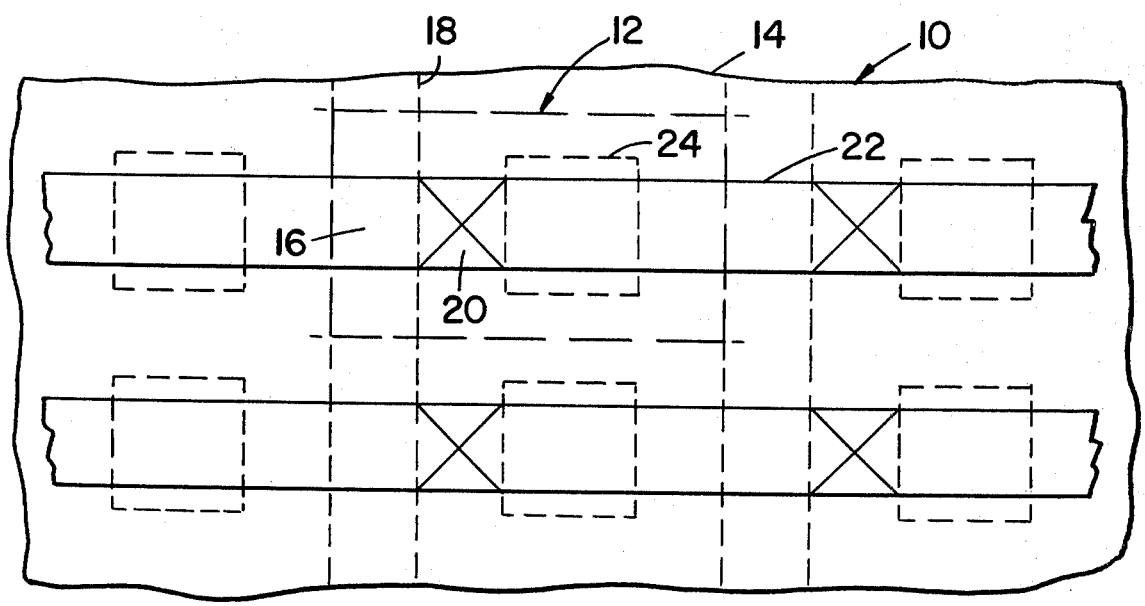
FIG_1 (PRIOR ART)
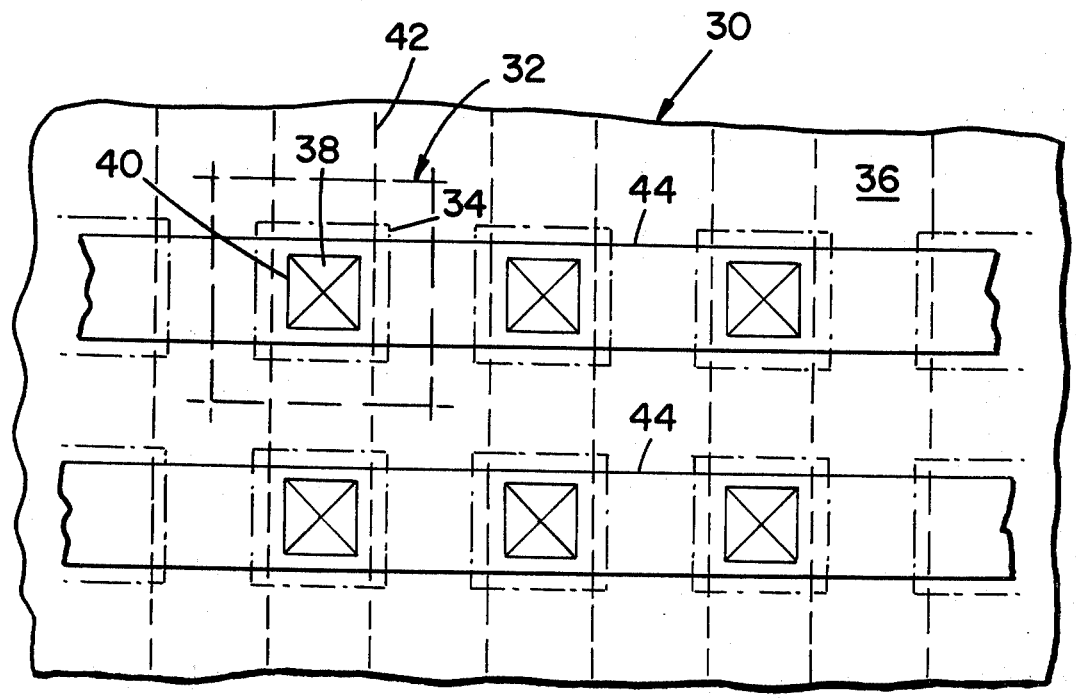
FIG_2

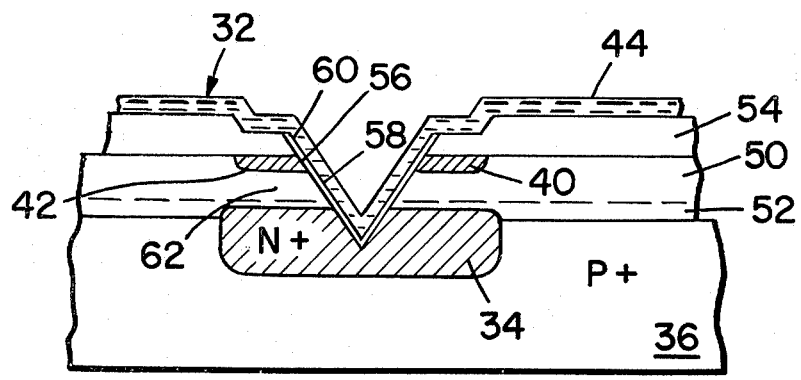
FIG_3
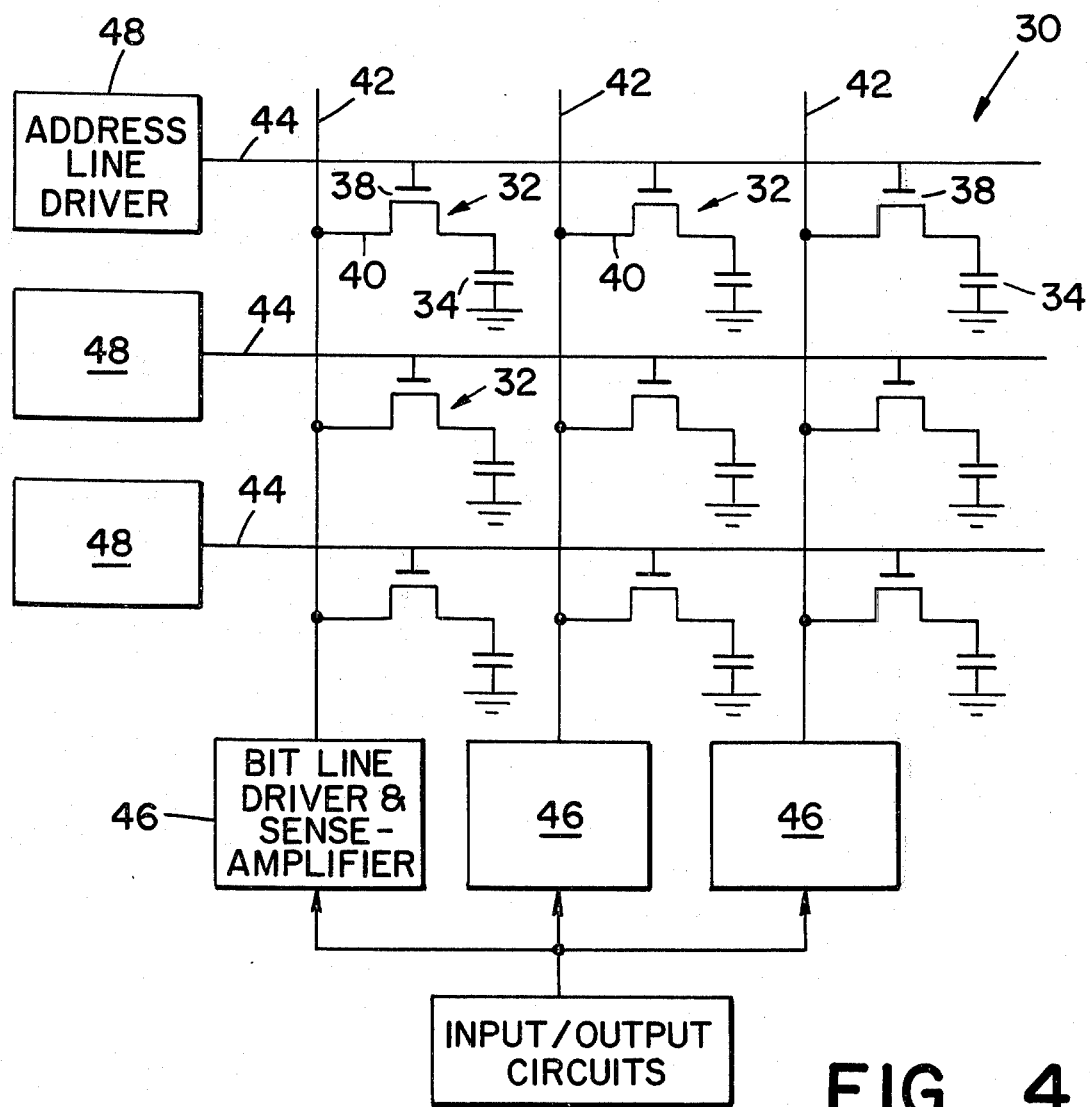
FIG_4

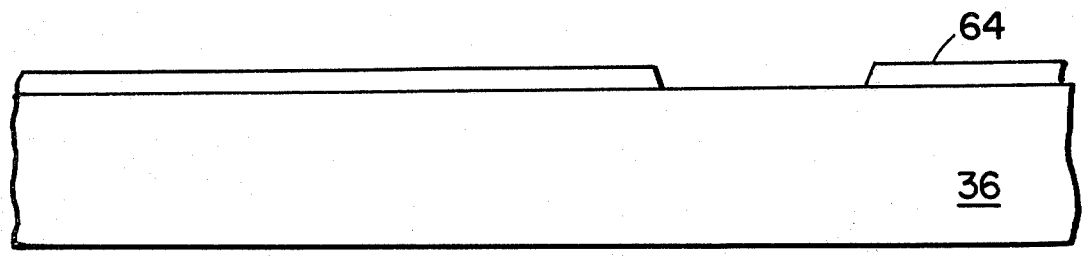
FIG_5 a
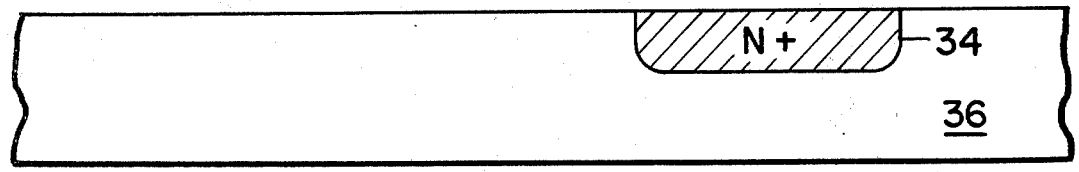
FIG_5 b
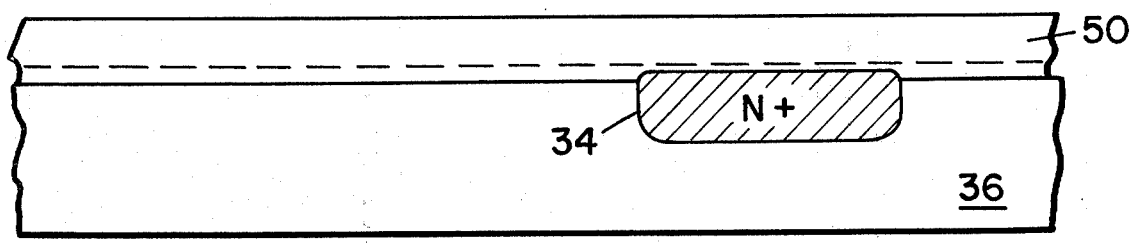
FIG_5 c
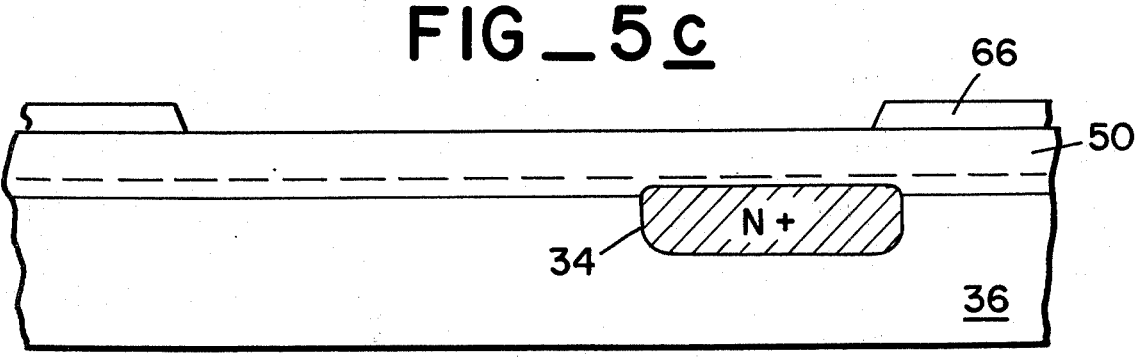
FIG_5 d
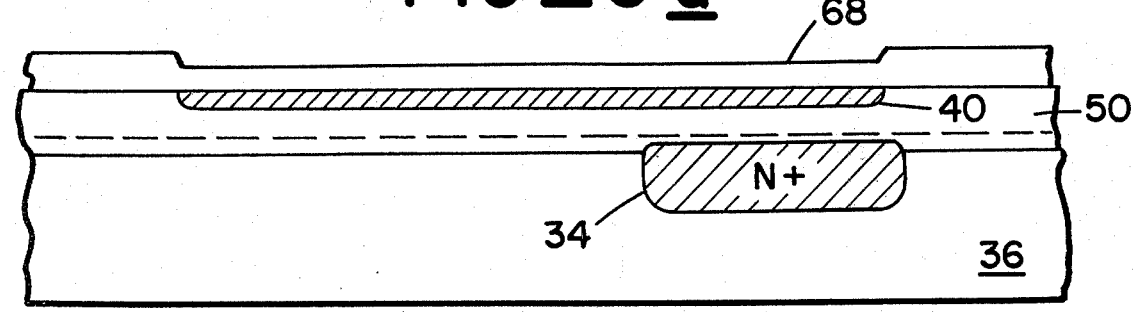
FIG_5 e

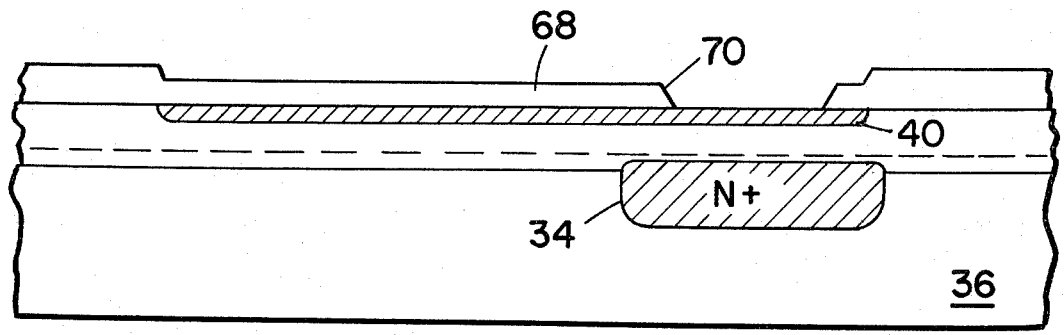
FIG_5 f
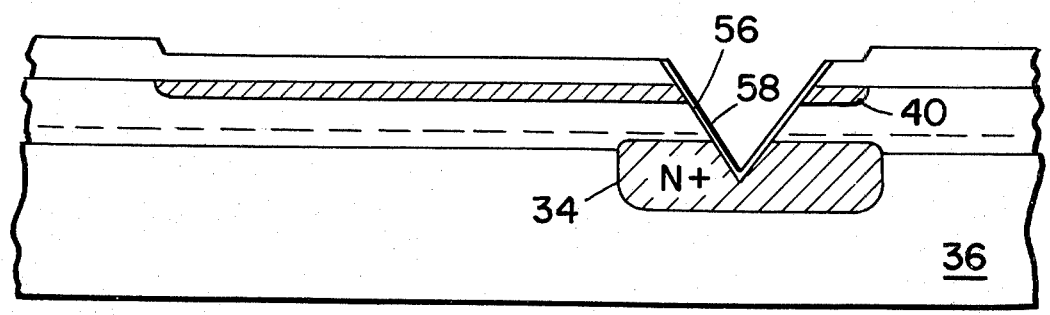
FIG_5 g
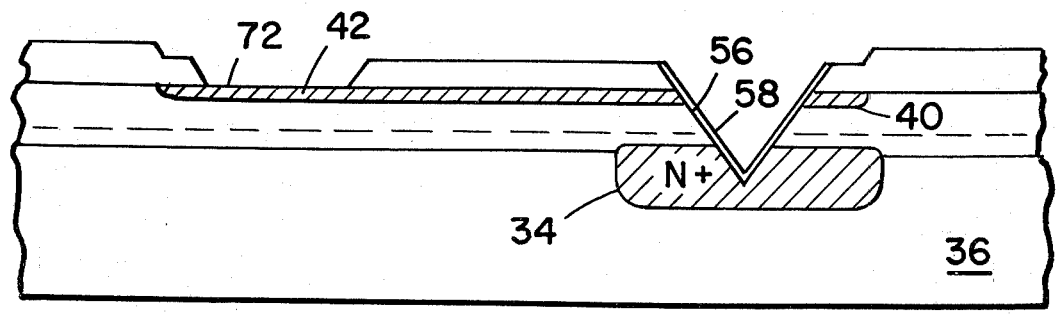
FIG_5 h
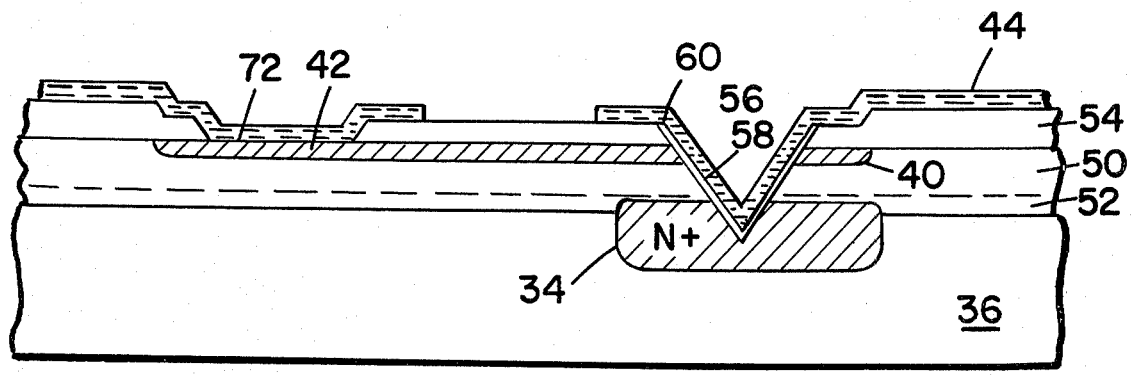
FIG_5 i

SINGLE IGFET MEMORY CELL WITH BURIED STORAGE ELEMENT

BACKGROUND OF THE INVENTION

Although various forms of semiconductor memory devices with different formats have been proposed, all have sought to provide a device with minimum area requirements that operate with adequate speed. Double-rail MOSFET (Metal Oxide Silicon Field Effect Transistor) memory systems have previously been disclosed, but such systems are relatively complex and require dual bit lines and four or six transistors per cell. So-called single-rail MOSFET memory systems utilizing three transistor cells have also been devised, and in U.S. Pat. No. 3,533,089 a single-rail memory with a single transistor cell and capacitive storage is disclosed. While this latter arrangement provided some reduction in the area required for each bit over the prior three transistor cell, its area requirements were still substantial because each cell included not only the drain and gate of the active transistor element but also a fairly large source-capacitor element located adjacent to the transistor gate. Semiconductor memory devices inherently include a large array of cells on each chip. Thus, the total area required for the source-capacitor in the aforesaid prior art significantly increased the total area of memory devices using them. Since the cost of such devices is directly related to area, it therefore became highly desirable to reduce the area required for each cell to an absolute minimum without sacrificing necessary performance characteristics. The present invention provides a solution to this problem.

SUMMARY OF THE INVENTION

In accordance with the invention, each memory cell of a semiconductor memory device utilizing an array of such cells comprises an active IGFET element formed within a recess. In each cell the active element is located directly above a passive element buried in the device substrate, the passive element being a combination source element and storage capacitor located below the active element. In a typical memory array the metal or silicon gate electrode of each active device is connected to an address line and the drain of the device is connected to a bit line where an input voltage is applied or an output voltage is sensed. The gate of each active element forms an inclined channel between the drain and source elements. Thus, in a digital mode of operation, a voltage equivalent to a One signal level is applied to the drain of each cell in the memory array on a semiconductor chip. The active element of each cell is turned on by applying a positive gate voltage (in the case of an N-channel device) to the connected address line for the cell. This charges the storage capacitor located below the active element, to the storage voltage. The active element is then turned off by returning the gate voltage on the address line to a more negative or a ground potential. This traps and holds the stored charge on the storage capacitor. Readout of the stored charge occurs when a reference voltage is placed on a selected bit line and a selected row address is turned on. This allows a stored charge to be transferred from the buried capacitor of the selected cell onto the bit line, thereby changing its voltage level. The voltage level change is then detected by a suitable sense-amplifier on the chip which is connected to an output bus line.

It is therefore a general object of the present invention to provide an improved random-access semiconductor read/write memory having essentially one IGFET per bit.

Another object of this invention is to provide a single IGFET transistor memory cell structure for accomplishing the aforesaid objective by storing digital or analog information in a capacitance located directly below the active element of the cell within the substrate of the structure.

A further object of this invention is to provide a semiconductor memory device comprised of an array of one IGFET transistor cells each utilizing a storage capacitor buried below the transistor of each cell and therefore not requiring any additional surface area.

Yet another object of this invention is to provide a semiconductor memory device that utilizes a minimum of area per bit compared with prior art single transistor cell devices and yet is particularly well adapted for ease and economy of manufacture.

A further object of this invention is to provide a semiconductor memory device that utilizes an array of V-type MOSFET active devices connected to a bit line with each device situated above a buried storage capacitor.

A still further object of the present invention is to provide an efficient method for making a semiconductor memory device utilizing an array of cells each comprising a V-type MOSFET active device situated above a buried passive element that is a combination source element and storage capacitor.

Other objects, advantages and features of the invention will become apparent from the following detailed description provided with the accompanying drawing.

BRIEF DESCRIPTION OF THE DRAWING

FIG. 1 is a schematic plan view of a portion of a prior art memory chip utilizing an array of single transistor cells;

FIG. 2 is a schematic plan view of a portion of a memory chip utilizing a VMOS single transistor cell according to the present invention;

FIG. 3 is an enlarged view in cross-section of a VMOS single transistor memory cell according to the present invention;

FIG. 4 is a schematic circuit diagram of a memory device utilizing single transistor memory cells;

FIGS. 5a – 5i are cross-sectional views illustrating a series of method steps for making a memory device with an array of VMOS memory cells according to the invention.

DETAILED DESCRIPTION OF EMBODIMENT

As illustrated in FIG. 1, a portion of a typical semiconductor memory device 10 of the prior art, as described in U.S. Pat. No. 3,533,089, comprises an array of memory cells 12 on a substrate or chip 14, each utilizing a single MOS transistor. The drains 16 of spaced apart but aligned MOS transistors are connected to common bit lines 18 and their gate electrodes 20 are connected to crossing metal address or word lines 22 on the semiconductor chip. A source element 24 for each active element which provides its capacitive storage, occupies an area on the chip adjacent the gate electrode for each cell. It is readily apparent that the chip area required for the source elements comprises a substantial percentage of the area of each cell 12 and thus entire area of the memory device. Other configurations of semiconductor memory devices using single transistor cells requiring the additional area for their storage capacitors are well known in the art.

Contrasted with the prior art of FIG. 1 is a comparable schematic plan view in FIG. 2, showing a portion of a semiconductor device 30 utilizing an araay of single transistor VMOS memory cells 32 according to the present invention. The term VMOS refers to a metal oxide silicon device formed on a sloped face of a V-shaped groove, as described in U.S. Patent application Ser. No. 392,668, filed Aug. 29, 1973. Here, the cells can be packed much closer together, as shown, because a storage capacitor 34 for each cell (which is roughly the same size as the capacitor for the device of FIG. 1, for purposes of comparison) is buried within the device substrate 36 directly under the active gate element 38 of the cell. The drains 40 of aligned cells are interconnected in diffused bit lines 42 that terminate at contact points (not shown) at the periphery of the chip in the conventional manner. As with the prior art memory devices, the aligned and spaced apart gate electrodes in the array of cells are connected in crossing address lines 44. For illustrative purposes, the prior art device 10 and the device 30 according to the present invention are drawn to the same scale in FIGS. 1 and 2 using typical MOS design rule dimensional relationships. Thus, it may be readily apparent that memory cells 32 of the device 30 require substantially less area than the cells 12 of the prior art device 10.

The structural details of a semiconductor memory device 32 according to the invention may be best understood by reference to FIG. 3 which shows a single cell in cross section. Each cell is formed on a substrate 36 of crystalline silicon material that may be P or N type material. In the example illustrated, the device is N-channel and the substrate is thus P+ material doped with boron and having a uniform thickness (e.g. 250 microns). Spaced above the bottom surface of the substrate and nearer its top surface is the N+ buried layer 34 of substantial thickness (e.g. 2 micron) and having any desirable planform shape (e.g. square, rectangular or circular). Near the upper surface of the substrate, surrounding and extending above and over the buried N+ layer 34 is an epitaxial layer 50 of lightly doped P material. Along the interface between the P+ substrate 36 and the epitaxial P layer 50, an intermediate layer 52 of P material may be used that also extends over the N+ layer 34 with a thickness of 0.5 to 1 micron. This layer 52 is also more heavily doped P material than the epitaxial layer 50 but may be less heavily P doped than the substrate. The layer 52 provides a means for controlling the threshold voltage of the VMOS transistor. Within the upper surface of the epitaxial layer 50 is a limited area of relative thin N+ material 40 that extends over and above the buried N+ layer 34 and is separated from it by the epitaxial layer. Covering the thin N+ layer and the surrounding epitaxial layer 50 is a layer 54 of silicon dioxide. Extending into the buried capacitor or N+ layer 34 is a recess 56 having a V-shaped cross section. A relatively thin gate oxide layer 58 is provided on the surfaces of this recess which extends into the buried layer 34 and over the exposed face of the N+ 40. Covering the gate oxide layer within the recess is a layer of conductive material 60. Thus, the thin N+ layer 40 comprises the drain of an MOS device and the buried layer 34 comprises the source of the same device with a channel area 62 between the source and drain being the epitaxial P material 50 and layer 52 which is covered by the gate oxide layer 58 and the conductive layer 60. In a typical semiconductor memory device the latter conductive layer, which may be a conventional metallization layer or a polycrystalline silicon layer, is continued between adjacent cells to form the address lines 44. Similarly, the drains of adjacent and aligned cells are interconnected by elongated portions of the same N+ diffusion layer 40 to form bit lines 42 of the memory device.

The electrical circuit representation for a portion of the memory device 30 of FIG. 2 is shown in FIG. 4. As indicated, the bit lines 42, etc. are arranged to cross a series of single address lines 44. At the cross-over location of each bit line and address line is a cell 32 comprised of an active transistor whose gate electrode 38 is connected to an address line 44 and whose drain 40 is connected to a bit line 42. Each bit line is connected to a suitable bit line driver and sense-amplifier circuit 46. The address lines are similarly connected to appropriate driver circuitry 48 which may be the same as that used in other semiconductor memory devices.

In a typical digital mode of operation for the memory device 30, information is stored by addressing selected cells through the driver circuitry 48 of appropriate address lines 44. The transistor of a cell is "turned on" when a positive gate voltage V2 (in the case of an N-channel device) is applied through an address line. When a voltage, $V_1$ equivalent to a One level is applied through a bit line driver circuit 46 to the transistor drain of the addressed cell, it charges up its storage capacitor 34 to a storage voltage level. The transistor of the cell is then turned off when the gate voltage level is returned to a lower potential and the storage voltage $V_s$ is then trapped and held on the storage capacitor 34. When the device is to be read out, the foregoing storage process is reversed. Thus, a reference voltage is placed on the selected bit line and the selected address line is supplied again with voltage $V_2$ which turns on the transistor of the activated cell. This allows the stored charge to be transferred from the buried capacitor of the cell onto the connected bit line. This changes the voltage level on the bit line from its reference voltage and the change is detected by the sense-amplifier or processing circuitry 46 for that bit line.

Fabrication of a memory device 30 utilizing an array of cells, as described, can be accomplished using conventional semiconductor processing steps in the following manner with reference to FIGS. 5a – 5i. As shown in FIG. 5a, a wafer of semiconductor material 36 is selected having the desired characteristics, such as p-type crystalline silicon having a uniform thickness (e.g. 250 microns). (Assuming that an N-channel device is being fabricated). In the embodiment of the invention illustrated, the starting material has a crystallographic orientation (such as 100 crystal plane material) such that V-type grooves or recesses can be formed therein by an anisotropic etchant. To form a first mask, the substrate 36 is provided with layer 64 of silicon dioxide which may be formed by oxidizing the substrate surface in steam at 1,000° – 1,200° C. The oxide layer is then treated with a suitable etchant (e.g. buffered hydrofluoric acid) to remove the oxide at areas on the substrate surface where the buried layer 34 are to be formed. As shown in FIG. 5b, a diffusion of N+ material (e.g., antimony) into the substrate is now performed to form a buried N+ layer 34 having a thickness of around 2 microns. The oxidation layer 64 is then removed leaving the substrate with an array of N⁺ layers 34 with the desired spacing on the substrate.

In the next step of the method, as shown in FIG. 5c, an epitaxial layer 50 of lightly doped P material is formed on the substrate surface and over the N⁺ regions 34. This layer can be formed by the thermal decomposition of silane ($S_1H_4$) at a temperature of around 800° – 1,000° C. in an epitaxial reactor to a thickness of around 2.5 microns. During the application of this epitaxial layer 50 an out diffusion of P material from the P⁺ substrate occurs forming the interface layer 52 that extends for about 0.5 microns above the N⁺ buried layer.

Now, the device is again provided with another oxide layer 66 by the same well known procedure, this time to a thickness of around 1 micron. This latter oxide layer is then etched as shown in FIG. 5d to form a mask with the desired pattern for the drain regions and bit lines of the device being fabricated. Now, a deposition and diffusion of N⁺ dopant material (e.g. phosphorus) is made through the latter mask, as shown in FIG. 5e, to form N⁺ regions 40 that are spaced above the now buried N⁺ regions 34.

Again, yet another oxidation step is used to regrow an oxide layer 68 over the presently exposed surface of the device, to a thickness of around 1 micron. As shown in FIG. 5f a third mask is now used to form openings 70 in the oxide layer 68 in areas directly above the buried N⁺ regions. Using an anisotropic etchant (e.g. hydrazine and water) a V-type recess 56 is formed in the device above each buried N⁺ region 34, the bottom of the recess penetrating into the buried region, as shown in FIG. 5g.

Using a conventional oxidation procedure, a gate oxide 58 with a thickness of typically 500A. to 1,000A. is now grown within the recess 56.

Now, as shown in FIG. 5h, using a fourth mask (a contact mask) the oxide layer 68 is etched away at preselected locations near the edge of the array to expose areas 72 of the upper N⁺ layer 40 where bit line contacts may be required. Following this, a metal deposition is made, using a metal mask, to form the conductive layer 60 covering the gate oxide 58 within each V-type recess and also forms contacts in the exposed N⁺ regions 72. (See FIG. 5i).

The foregoing describes one series of method steps for making a semiconductor memory device with an array of single transistor cells 32 according to the invention. However, other methods or variations of the aforesaid method could be employed. For example, a selective oxidation type of process using silicon nitride ($Si_3 N_4$) layers as an etch and oxidation barrier may be used to give substantially the same structure. Also, additional masks may be provided to give additional structures such as planar surface MOS transistors, implanted resistors, poly-silicon gates, etc. In addition, a passivation layer may be provided on top of the metal layer 58 in the conventional manner to help protect the device and preserve its structural and electrical integrity.

To those skilled in the art to which this invention relates, many changes in construction and widely differing embodiments and applications of the invention will suggest themselves without departing from the spirit and scope of the invention. For example, in the specific embodiment illustrated and described, the uppermost N⁺ drain regions 40 of aligned groups of cells are interconnected by the conductive bit lines. However, it would be within the scope of the invention to provide the necessary bit lines of a memory device by interconnecting the buried N⁺ regions 34 instead of the drain regions.

The disclosures and the description herein are purely illustrative and are not intended to be in any sense limiting.

I claim:

1. In a semiconductor memory device a single transistor cell comprising:
    a substrate of low resistivity semiconductor material of a preselected polarity;
    an epitaxial layer on said substrate having the same polarity as said substrate;
    a first region of material buried within said substrate and having the opposite polarity therefrom;
    a second region of material within said epitaxial layer having the same polarity as and spaced upwardly from said first region;
    a gate means located within a recess on said device, said recess extending downwardly from its upper surface through said second region and into said first region, said gate means extending between said first and second regions; and
    conductive contact means covering said gate means within said recess.

2. The cell as described in claim 1 wherein said first and second regions and said gate means form an IGFET device.

3. The cell as described in claim 1 wherein said epitaxial layer has a substantially higher resistivity than said substrate.

4. The cell as described in claim 1 wherein said recess is V-shaped in cross section.

5. The cell as described in claim 1 wherein said recess has an inverse pyramidial shape and said gate means extends along at least one sloping side of said recess.

6. The cell as described in claim 1 including an out diffused region extending within said epitaxial layer adjacent its interface with said substrate and over said buried first region, said out diffused region having an impurity concentration less than said substrate and greater than said epitaxial layer.

7. The cell as described in claim 1 wherein said first region comprises a combined source region and storage capacitor and extends slightly into said epitaxial layer.

8. The cell as described in claim 1 wherein said second region is thinner than said first region and comprises the drain of a single MOSFET for the cell.

9. The cell as described in claim 1 wherein said second region is extended from one side of said recess to form an interconnecting conductive path adapted to be connected to a contact means.

10. A single IGFET cell for a semiconductor memory device comprising:
    a substrate of P-type semiconductor material of a predetermined impurity concentration;
    an epitaxial layer of P material on said substrate having a lower impurity concentration and therefore a higher resistivity than said substrate material;
    a first region of N type material buried within said substrate;
    a second region of N type material within said epitaxial layer and spaced directly above said buried first region;
    gate means located within a recess of said device that extends downwardly from its upper surface through said second region and into said first region, said gate means extending between said first and second N regions;

a non-conductive layer covering said epitaxial layer and said second region and surrounding said recess; and conductive contact means covering said gate means within said recess.

11. The IGFET cell according to claim 10 including an intermediate layer of P material between said substrate and said epitaxial layer and covering said first N region, said intermediate layer having an impurity concentration less than said substrate and greater than said epitaxial layer.

12. The IGFET cell according to claim 10 wherein said recess has a V-shape in a cross section taken perpendicular to the surface of the epitaxial layer, said first region forming a source and said second region forming a drain for the IGFET.

13. A semiconductor read/write memory device comprising:

a substrate of low resistivity semiconductor material of a preselected polarity;

an epitaxial layer on said substrate having the same polarity but a higher resistivity than said substrate;

an array of memory cells on said substrate comprising a plurality of spaced apart first regions of material buried within said substrate and having the opposite polarity therefrom;

a plurality of second regions of material within said epitaxial layer each having the same polarity as and spaced upwardly from a said first region;

a plurality of gate means for each cell, each gate means being located within a recess on said device, each said recess extending downwardly from the upper surface of said epitaxial layer through a said second region and into a said first region, and thus extending between a pair of said first and second regions;

conductive contact means covering said gate means within each said recess;

first conductive means interconnecting said contact means to form address lines for said memory device; and second conductive means interconnecting said second regions of said cells to form bit lines for said memory device.

14. The memory device of claim 13 wherein said first and second regions and said gate means of each said cell form an active IGFET and said first region also forms a buried storage capacitor for the cell.

15. The memory device of claim 14 wherein said substrate is P-type semiconductor of a predetermined impurity concentration and said epitaxial layer is also P material having a lower impurity concentration.

16. The memory device of claim 15 including an intermediate layer of P material between said substrate and said epitaxial layer and covering said first N region, said intermediate layer having an impurity concentration less than said substrate and greater than said epitaxial layer.

17. The memory device of claim 14 wherein each said active IGFET is formed on the sloped walls of a recess having a V-shaped cross section.

* * * * *